United States Patent
Noji

(10) Patent No.: US 12,106,986 B2
(45) Date of Patent: Oct. 1, 2024

(54) SEMICONDUCTOR INSPECTION DEVICE AND METHOD OF INSPECTING A SEMICONDUCTOR WAFER

(71) Applicant: FUJI ELECTRIC CO., LTD., Kawasaki (JP)

(72) Inventor: Noriaki Noji, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 412 days.

(21) Appl. No.: 17/462,965

(22) Filed: Aug. 31, 2021

(65) Prior Publication Data

US 2022/0115252 A1    Apr. 14, 2022

(30) Foreign Application Priority Data

Oct. 9, 2020   (JP) .................................. 2020-171240

(51) Int. Cl.
  *H01L 21/67*   (2006.01)
  *H01L 21/66*   (2006.01)
  *H01L 21/683*  (2006.01)

(52) U.S. Cl.
  CPC .... *H01L 21/67288* (2013.01); *H01L 21/6838* (2013.01); *H01L 22/12* (2013.01)

(58) Field of Classification Search
  None
  See application file for complete search history.

(56) References Cited

U.S. PATENT DOCUMENTS

| 5,177,878 | A  | * | 1/1993 | Visser | ................... | C23C 16/466 |
|---|---|---|---|---|---|---|
|  |  |  |  |  |  | 34/239 |
| 5,191,218 | A  | * | 3/1993 | Mori | ....................... | G03F 7/707 |
|  |  |  |  |  |  | 269/21 |
| 8,102,512 | B2 | * | 1/2012 | Shibuta | ............. | H01L 21/68735 |
|  |  |  |  |  |  | 355/72 |

(Continued)

FOREIGN PATENT DOCUMENTS

| JP | 2003303878 A | 10/2003 |
|---|---|---|
| JP | 2007214336 A | 8/2007 |

(Continued)

OTHER PUBLICATIONS

Japanese Office Action dated Jul. 9, 2024, in the counterpart Japanese Patent Application No. 2020-171240.

*Primary Examiner* — Jethro M. Pence

(74) *Attorney, Agent, or Firm* — Rabin & Berdo, P.C.

(57) ABSTRACT

A semiconductor inspection device, including a stage having first and second surfaces opposite to each other, a first holding part for holding the semiconductor wafer apart from the first surface and protruding from the first surface of the stage, a plurality of air suction holes and air supply holes, through which a gas is suctioned from or supplied to a space between the semiconductor wafer and the stage, and an imaging unit configured to capture an image of a second main surface of the semiconductor wafer, after the gas is concurrently suctioned from, and supplied to, the space between the semiconductor wafer and the stage, to thereby correct a warpage of the semiconductor wafer. Each of the air suction holes and the air supply holes has a first opening provided at a predetermined position in the first surface of the stage, and a second opening for connecting to a suction unit or an air supply unit.

9 Claims, 7 Drawing Sheets

(56) References Cited

U.S. PATENT DOCUMENTS

| | | | |
|---|---|---|---|
| 8,748,780 B2* | 6/2014 | Moro | C23C 16/46 |
| | | | 269/21 |
| 9,390,948 B2* | 7/2016 | Taga | H01L 21/67092 |
| 11,367,702 B2* | 6/2022 | Tanabe | H01L 24/75 |
| 11,538,704 B2* | 12/2022 | Watanabe | H01J 37/32788 |
| 11,551,947 B2* | 1/2023 | Kakinuma | H01L 21/56 |
| 11,565,351 B2* | 1/2023 | Suzuki | H01L 21/68785 |
| 2007/0034331 A1* | 2/2007 | Yamamoto | H01L 21/6838 |
| | | | 156/538 |
| 2008/0171131 A1 | 7/2008 | Moro et al. | |
| 2008/0230183 A1* | 9/2008 | Yamamoto | H01L 21/67092 |
| | | | 156/538 |
| 2010/0055351 A1* | 3/2010 | Kato | C23C 16/45521 |
| | | | 118/712 |
| 2015/0028907 A1 | 1/2015 | Shinohara et al. | |
| 2016/0141199 A1* | 5/2016 | Tse | H01L 21/67092 |
| | | | 269/21 |
| 2016/0231653 A1* | 8/2016 | Nagasaka | G03F 7/70341 |
| 2018/0246417 A1* | 8/2018 | Shibuta | H01L 21/6875 |
| 2023/0014205 A1* | 1/2023 | Kim | H01L 21/68785 |
| 2023/0146344 A1* | 5/2023 | Yudovsky | C23C 16/458 |
| | | | 118/728 |
| 2023/0215704 A1* | 7/2023 | Hirayama | H02N 13/00 |
| | | | 361/234 |

FOREIGN PATENT DOCUMENTS

| | | |
|---|---|---|
| JP | 2008177303 A | 7/2008 |
| JP | 2014195016 A | 10/2014 |
| JP | 2015026765 A | 2/2015 |
| JP | 2016092025 A | 5/2016 |
| JP | 2017027974 A | 2/2017 |

* cited by examiner

SEMICONDUCTOR INSPECTION DEVICE AND METHOD OF INSPECTING A SEMICONDUCTOR WAFER

CROSS REFERENCE TO RELATED APPLICATIONS

This application is based upon and claims the benefit of priority of the prior Japanese Patent Application No. 2020-171240, filed on Oct. 9, 2020, the entire contents of which are incorporated herein by reference.

BACKGROUND OF THE INVENTION

1. Field of the Invention

Embodiments discussed herein related to a semiconductor inspection device and a method of inspecting a semiconductor wafer.

2. Description of the Related Art

Conventionally, in a power semiconductor device such as a metal oxide semiconductor field effect transistor (MOSFET) including insulated gates having a 3-layer structure including a metal, an oxide film, and a semiconductor, or an insulated gate bipolar transistor (IGBT), etc. employing a vertical element device structure through which a main current passes in a depth direction or a thickness direction (direction opposite to the depth direction) of a semiconductor chip, reduced thickness of the semiconductor wafer is demanded to reduce ON resistance.

FIG. 8 is a cross-sectional view schematically depicting a state of a semiconductor wafer during inspection by a conventional semiconductor inspection device. To reduce the thickness of a semiconductor wafer 113, a polishing process of polishing the semiconductor wafer 113 from either a main surface 113a or a main surface 113b thereof is performed; however, warpage of the semiconductor wafer 113 occurs due to the polishing process. Warpage of the semiconductor wafer 113 is when the semiconductor wafer 113 has a shape, in a cross-sectional view thereof, curved in a protruding shape that protrudes in a direction toward a stage 111 (hereinafter, downward protrusion) (FIG. 8), or a shape, in a cross-sectional view of the semiconductor wafer 113, curved in a protruding shape that protrudes in a direction away from the stage 111 (hereinafter, upward protrusion) (not depicted).

When warpage of the semiconductor wafer 113 occurs, an interval h101 between an inspection head (imaging unit) 112 of a semiconductor inspection device 110 and the main surface (inspection surface) 113b of the semiconductor wafer 113 is not constant in the area of the inspection surface 113b of the semiconductor wafer 113. Therefore, when external inspection of chip regions (portions constituting semiconductor chips, not depicted) adjacent to one another is performed continuously by a single scan 114 (horizontal arrow) by the inspection head 112, spanning an entire area of the inspection surface 113b of the semiconductor wafer 113, a depth of focus h102 cannot be kept constant. Accordingly, inspection sensitivity of the external inspection in the inspection surface 113b of the semiconductor wafer 113 is unstable.

In particular, accompanying increases in the diameter of the semiconductor wafer 113 (larger diameter), warpage of the semiconductor wafer 113 also increases and therefore, adverse effects on the external inspection of the semiconductor wafer 113 due to the warpage of the semiconductor wafer 113 also increase. In this manner, as a conventional technique to solve problems occurring due to warpage of the semiconductor wafer 113, semiconductor inspection devices have been proposed that correct and flatten the warpage of the semiconductor wafer by suctioning out air between the semiconductor wafer and the stage or by suctioning out air and supplying air between the semiconductor wafer and the stage (for example, refer to Japanese Laid-Open Patent Publication No. 2014-195016, Japanese Laid-Open Patent Publication No. 2015-026765, Japanese Laid-Open Patent Publication No. 2017-027974, and Japanese Laid-Open Patent Publication No. 2007-214336).

In Japanese Laid-Open Patent Publication No. 2014-195016, the stage on which the semiconductor wafer is placed has multiple air suction holes that suction out atmosphere (air) between the semiconductor wafer and the stage, creating negative pressure and partial adhesion between the stage and a main surface of the semiconductor wafer facing the stage (hereinafter, facing surface). Regarding the multiple air suction holes of the stage, at the surface of the semiconductor wafer, attachment strength for air suction holes corresponding to a portion of the semiconductor wafer where an amount of warpage thereof is relatively large is made greater than the attachment strength for air suction holes corresponding to a portion of the semiconductor wafer where the warpage thereof is relatively small, whereby the warpage of the semiconductor wafer is corrected and flatten, and contact resistance between the semiconductor wafer and the stage is reduced.

In Japanese Laid-Open Patent Publication No. 2015-026765, the stage on which the semiconductor wafer is placed has multiple air suction holes that suction out atmosphere between the semiconductor wafer and the stage, and a suction path having a spiral shape in a plan view thereof, connecting all of the air suction holes when negative pressure and partial adhesion between the semiconductor wafer and the facing surface thereof occurs. Suction force by a vacuum pump that suctions out the atmosphere in the suction path, first, is applied to a center of the semiconductor wafer, directly on the spiral-shaped suction path, near a starting end thereof, and with a gradual delay, is progressively applied to portions of the semiconductor wafer directly on portions of the suction path in a direction toward an outer periphery of the suction path, whereby warpage of the semiconductor wafer is corrected and flattened.

In Japanese Laid-Open Patent Publication No. 2017-027974, the stage on which the semiconductor wafer is placed is provided on a chuck stage and by negative pressure created by the chuck stage, the semiconductor wafer is attached and fixed at a surface opposite to the surface in contact with the chuck stage. Further, the stage has multiple grooves on the surface thereof in contact with the chuck stage and has multiple air suction holes penetrating through bottoms of the grooves from the surface on which the semiconductor wafer is placed. At least two air suction holes penetrate a single groove, distribution density of the air suction holes is varied in a direction from a center to an end of the semiconductor wafer, and the negative pressure at the surface of the semiconductor wafer is varied, whereby warpage of the semiconductor wafer is corrected and flattened.

In Japanese Laid-Open Patent Publication No. 2007-214336, the stage on which the semiconductor wafer is placed has air suction holes that suction out air from between the semiconductor wafer and the stage and air supply holes that supply air in between the semiconductor wafer and the stage. The air suction holes and the air supply holes are disposed in a radial shape from a center of the stage. Air is supplied between the semiconductor wafer and the stage from the air supply holes and air is suctioned out from between the semiconductor wafer and the stage from exhaust ports, making an air layer formed between the semiconductor wafer and the stage substantially uniform (no occurrence of pressure distribution), whereby warpage of the semiconductor wafer is corrected and flattened.

FIG. 9 is a cross-sectional view schematically depicting another example of a state of a semiconductor wafer during inspection by a conventional semiconductor inspection device. A conventional semiconductor inspection device 120 depicted in FIG. 9 is a semiconductor-wafer external inspection device having a stage 121 on which a semiconductor wafer 123 is placed and an inspection head 122 that captures an image of the semiconductor wafer 123. The stage 121 is a general flat-shaped porous chuck formed using a porous ceramic and has multiple pores constituting air suction holes (indicated by vertical stripe hatching), spanning an entire area of a surface (hereinafter, placement surface) 121a on which the semiconductor wafer 123 is placed. The air suction holes penetrate through the stage 121, between both surfaces (flat surfaces) 121a, 121b thereof.

By a suction 125 (arrow pointing downward) of air between the semiconductor wafer 123 and the stage 12 from the air suction holes, an entire area of a main surface (facing surface) 123a of the semiconductor wafer 123 facing the stage 121 is pressed against the placement surface 121a of the stage 121. As a result, even when the semiconductor wafer 123 is warped (refer to the semiconductor wafer 113 in FIG. 8), the warpage is corrected and flattened. Therefore, an interval h201 between the inspection head 122 and an inspection surface 123b of the semiconductor wafer 123 becomes constant at the surface of the semiconductor wafer 123 and during a single scan 124 (horizontal arrow) by the inspection head 122, a depth of focus h202 is kept constant.

SUMMARY OF THE INVENTION

According to the present invention, a semiconductor inspection device includes a stage having a first surface, for placing thereon a semiconductor wafer that has a first main surface and a second main surface, with the first main surface thereof facing the stage, and a second surface opposite to the first surface; a first holding part provided on the stage and protruding from the first surface of the stage, the first holding part being configured to be in contact with the first main surface of the semiconductor wafer to thereby hold the semiconductor wafer, such that the first main surface of the semiconductor wafer is apart from the first surface of the stage, to thereby form a space therebetween; a plurality of air suction holes, through which a gas in the space between the semiconductor wafer and the stage is suctioned, each of the air suction holes having a first opening provided at a predetermined first position in the first surface of the stage, and a second opening for connecting to a suction unit; a plurality of air supply holes for supplying the gas to the space between the semiconductor wafer and the stage, each of the air supply holes having a first opening provided at a predetermined second position in the first surface of the stage, and a second opening for connecting to an air supply unit; and an imaging unit configured to capture an image of the second main surface of the semiconductor wafer, after the gas is concurrently suctioned through the air suction holes from, and supplied through the air supply holes to, the space between the semiconductor wafer and the stage, to thereby correct a warpage of the semiconductor wafer.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
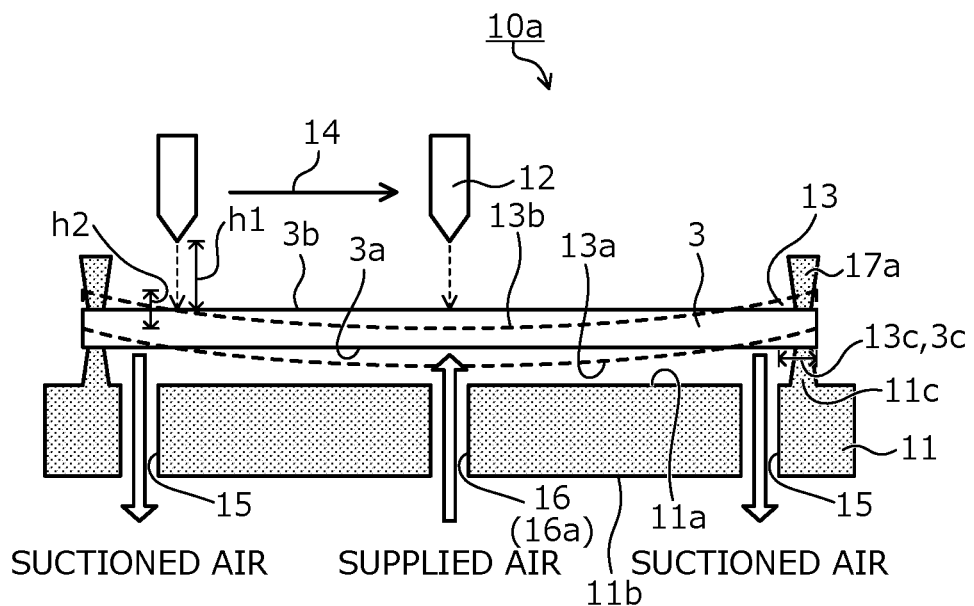
FIG. 1 is a cross-sectional view schematically depicting an example of a state of a semiconductor wafer during inspection by a semiconductor inspection device according to an embodiment.

First, problems associated with the conventional techniques are described. In the conventional semiconductor inspection device 120 described above (refer to FIG. 9), a defective area may occur in the semiconductor wafer 123 due to the semiconductor wafer 123 being in contact with the stage 121. This problem appears particularly prominently in the semiconductor wafer 123 in which warpage occurs. A reason for this is that when warpage of the semiconductor wafer 123 occurs, to cause a portion of the semiconductor wafer 123 apart from the stage 121 to be contact with the stage 121, the suction 125 has to be applied to the semiconductor wafer 123 by a large suction force compared to that in an instance in which the semiconductor wafer 123 is attached as is in a warped state to simply be fixed to the stage 111.

The suction force of the suction 125 applied to the semiconductor wafer 123 is substantially equal throughout of the placement surface 121a of the stage 121 (porous chuck). Therefore, the suction 125 is applied to an entire area of the facing surface 123a of the semiconductor wafer 123 by a suction force to make a portion of the facing surface 123a of the semiconductor wafer 123 furthest apart from the stage 121 to be in contact with the stage 121, whereby a portion of the facing surface 123a of the semiconductor wafer 123 relatively close to the stage 121 is strongly pressed against the stage 121. As a result, during inspection of the semiconductor wafer 123, crushing and/or chipping of an electrode pattern on the facing surface 123a of the semiconductor wafer 123, adhesion of foreign particles, scratching, etc. of the facing surface 123a occurs.

Further, in instances of open circuits and short circuits due to crushing and/or chipping of a pattern, blocking of ion implantation and/or short circuit due to foreign particles, when the facing surface 123a of the semiconductor wafer 123 is the back surface of the semiconductor chip, defects such as disjuncture of a field stop (FS) layer due to scratches may occur. A portion of the semiconductor wafer 123 relatively close to the stage 121 is a portion near an apex in substantially a center of the facing surface 123a of the semiconductor wafer 123 when warpage curving the semiconductor wafer 123 in a downward protruding shape occurs and is a portion near ends of the facing surface 123a of the semiconductor wafer 123 when warpage curving the semiconductor wafer 123 in an upward protruding shape occurs.

Embodiments of a semiconductor inspection device and a method of inspecting a semiconductor wafer according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and are not repeatedly described.

Figure 2:
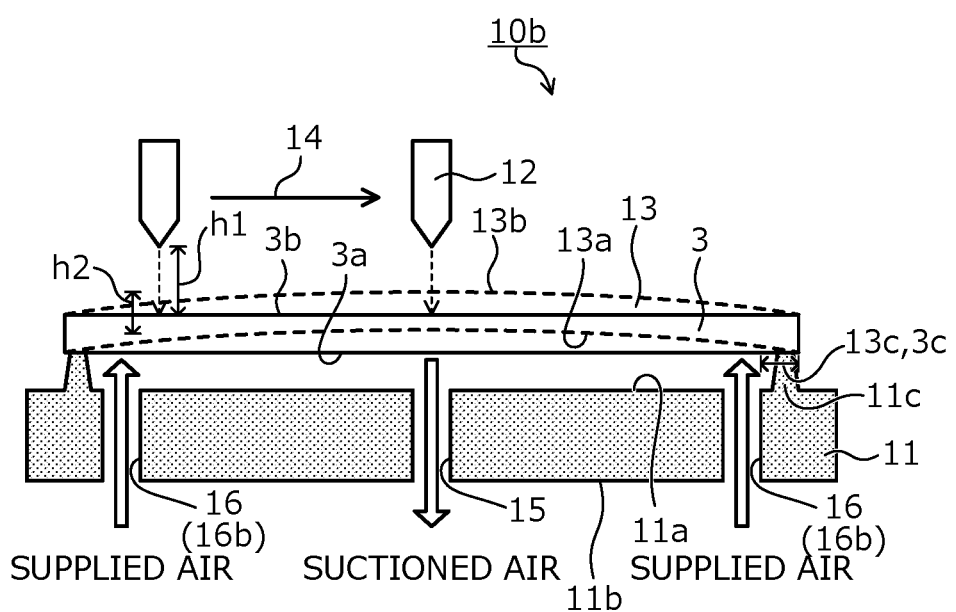
FIG. 2 is a cross-sectional view schematically depicting an example of a state of a semiconductor wafer during inspection by the semiconductor inspection device according to the embodiment.
Figure 3:
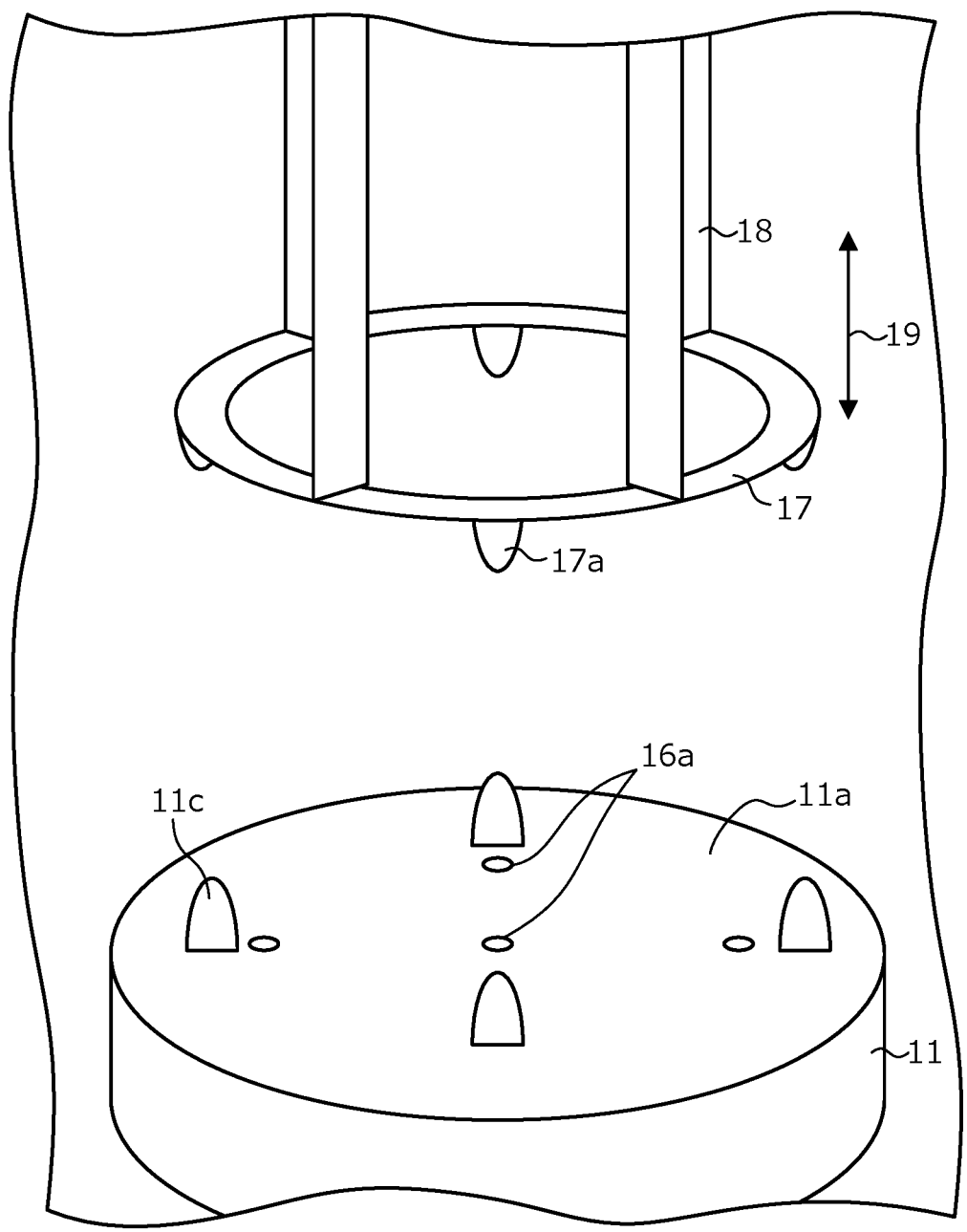
FIG. 3 is a perspective view schematically depicting another example of the semiconductor inspection device according to the embodiment.
Figure 4:
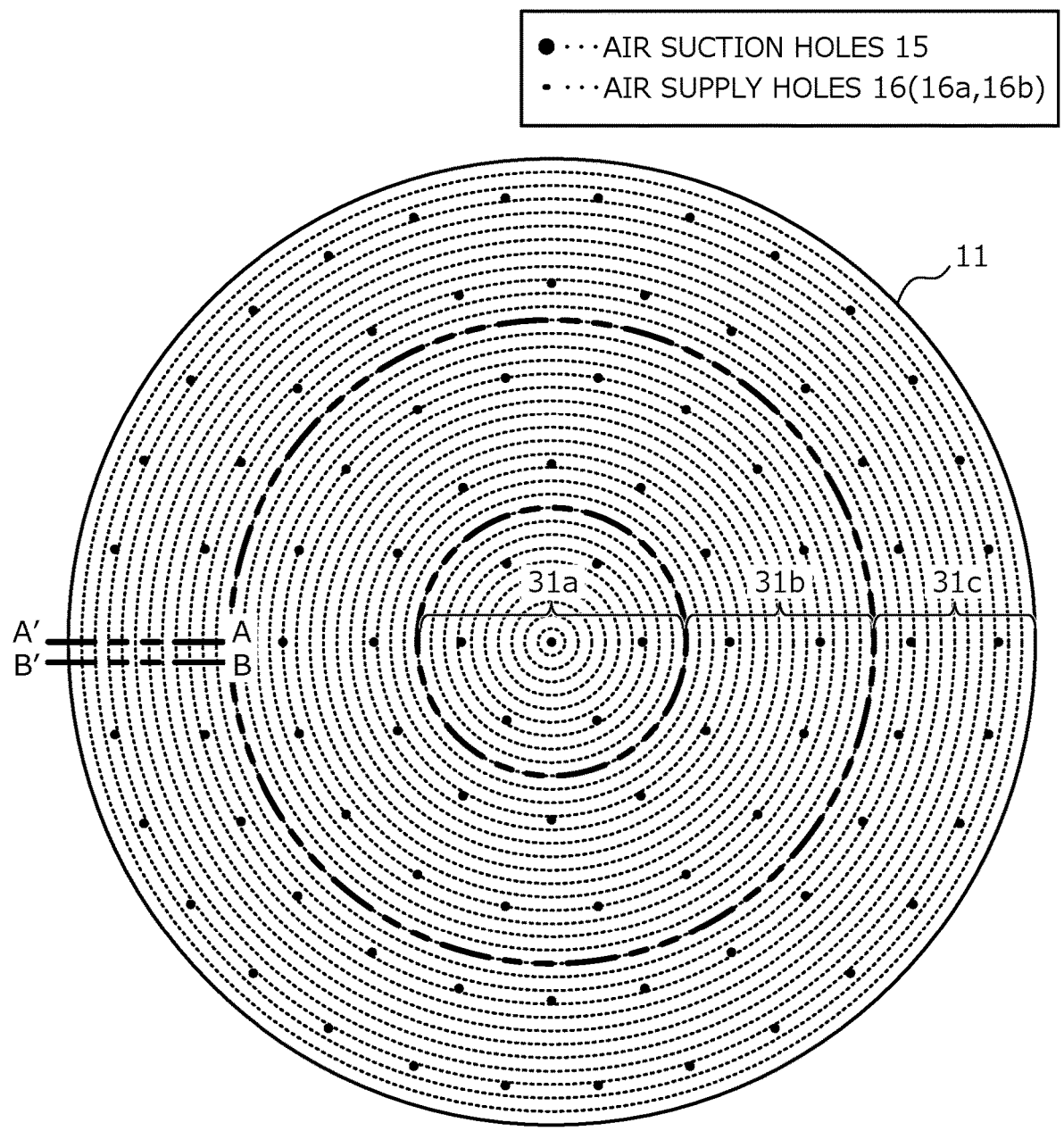
FIG. 4 is a plan view depicting a state when another example of the semiconductor inspection device according to the embodiment is viewed from a placement surface of a stage.
Figure 5:
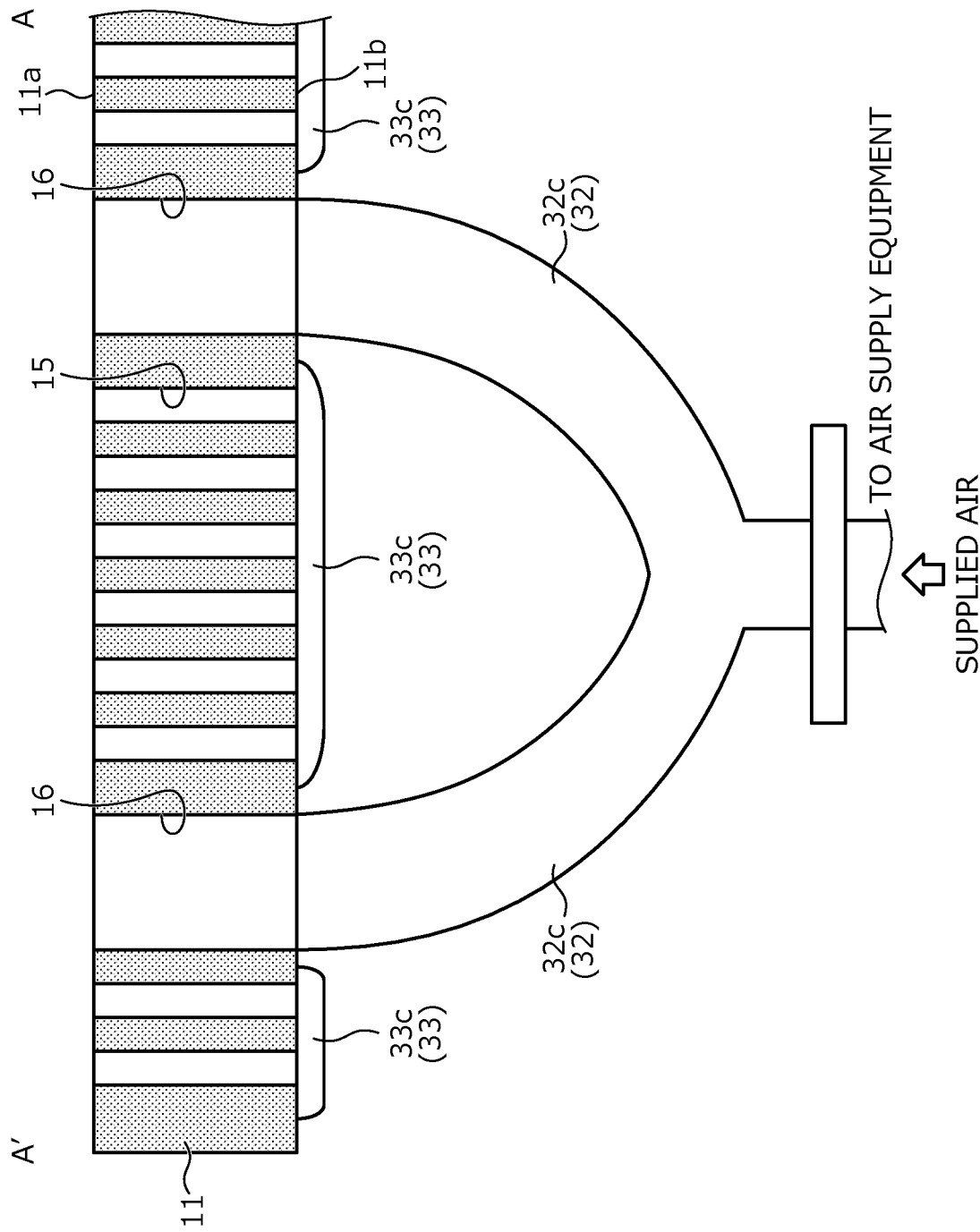
FIG. 5 is a cross-sectional view along cutting line A-A' in FIG. 4.
Figure 6:
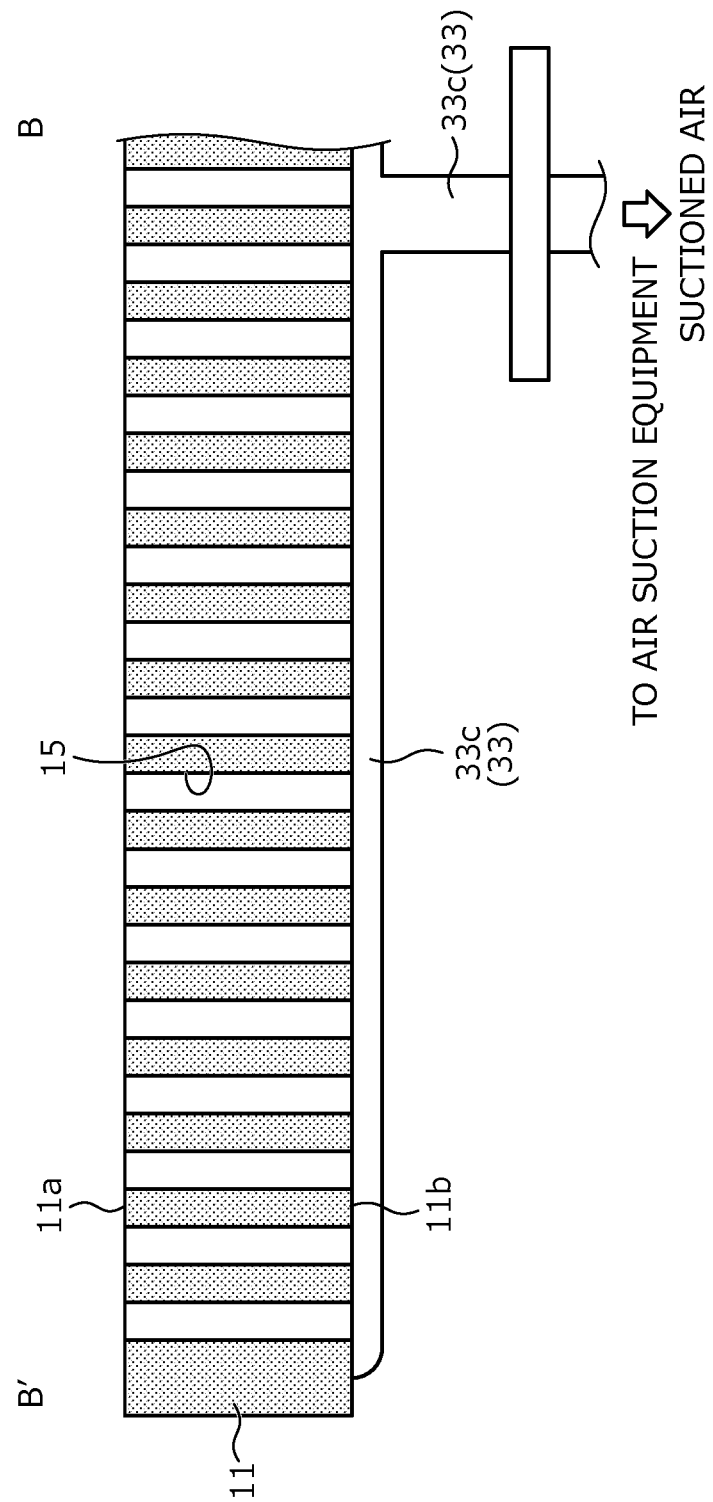
FIG. 6 is a cross-sectional view along cutting line B-B' in FIG. 4.
Figure 7:
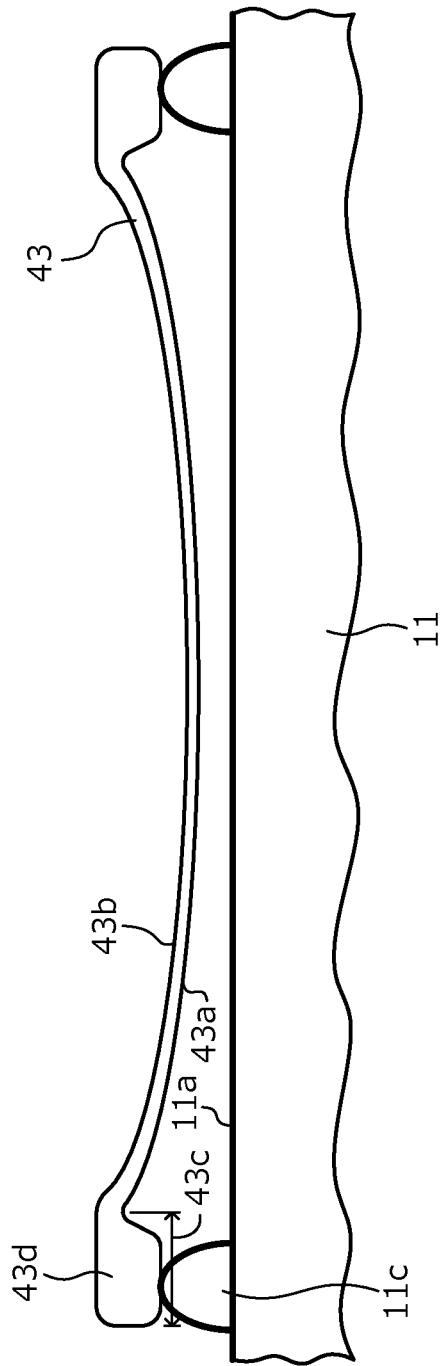
FIG. 7 is a cross-sectional view schematically depicting an example of a state of another semiconductor wafer during inspection by the semiconductor inspection device according to the embodiment.

A structure of a semiconductor inspection device according to an embodiment is described. FIGS. 1 and 2 are cross-sectional views schematically depicting examples of states of a semiconductor wafer during inspection by the semiconductor inspection device according to the embodiment. FIG. 3 is a perspective view schematically depicting another example of the semiconductor inspection device according to the embodiment. FIG. 4 is a plan view depicting a state when another example of the semiconductor inspection device according to the embodiment is viewed from a placement surface of a stage. FIGS. 5 and 6 are respectively cross-sectional views along cutting lines A-A' and B-B' in FIG. 4. FIG. 7 is a cross-sectional view schematically depicting an example of a state of another semiconductor wafer during inspection by the semiconductor inspection device according to the embodiment.

Semiconductor inspection devices 10a, 10b according to the embodiment depicted in FIGS. 1 and 2 are semiconductor-wafer external inspection devices having a stage 11 on which a semiconductor wafer 13 (3) is placed, an inspection head (imaging unit) 12 that captures an image of an inspection surface 3b of the semiconductor wafer 3 in a state in which warpage thereof has been corrected, and a conveying unit (not depicted) that conveys the inspection head 12. The semiconductor inspection devices 10a, 10b according to the embodiment differs from a typical semiconductor-wafer external inspection device in that the semiconductor inspection devices 10a, 10b include a mechanism of correcting warpage of the semiconductor wafer 13, by the stage 11. In FIGS. 1 and 2, the semiconductor wafer 13 before correction of warpage (in FIGS. 1 and 2, direction of curvature of warpage differs) is indicated by dashed lines while the semiconductor wafer 3 in a state in which the warpage is corrected is indicated by solid lines.

Figure 8:
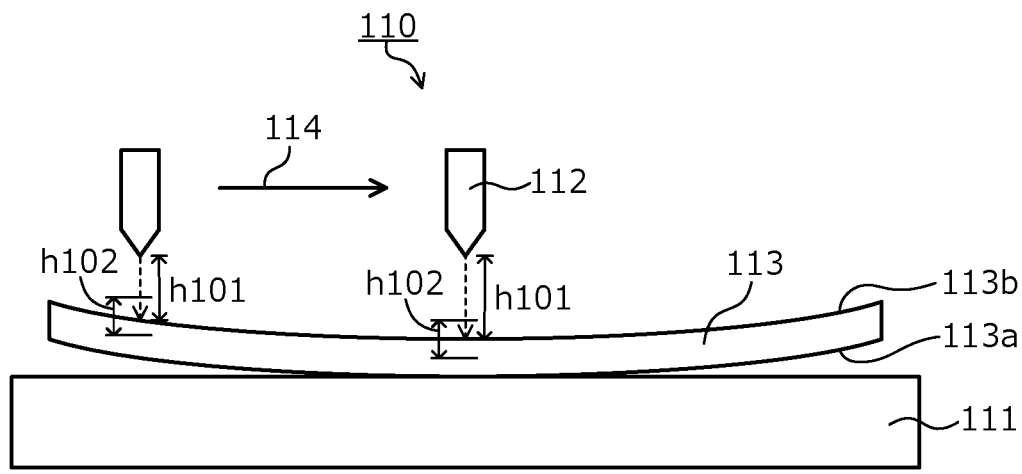
FIG. 8 is a cross-sectional view schematically depicting a state of a semiconductor wafer during inspection by a conventional semiconductor inspection device.

The typical semiconductor-wafer external inspection device is, for example, the conventional the semiconductor inspection device 110 depicted in FIG. 8, having the stage 111 including an attached unit that attaches the semiconductor wafer 113 to simply fix the semiconductor wafer 113 as is in a warped state, the typical semiconductor-wafer external inspection device capturing an image of an entire area of the inspection surface 113b of the semiconductor wafer 113 by the single scan 114 of the inspection surface 113b of the semiconductor wafer 113 on the stage 111, by the inspection head (imaging unit) 112 that keeps the predetermined depth of focus h102 constant. In particular, the typical semiconductor-wafer external inspection device is, for example, ZI-2000 (trademark) of SCREEN Holdings Co., Ltd. (registered trademark), etc.

In the semiconductor wafer 13 under inspection of the embodiment, in a manufacturing process of a semiconductor device, a predetermined amount of warpage in a predetermined direction of curvature corresponding to an element device structure of the semiconductor wafer 13 occurs due to a process of reducing a thickness of the semiconductor wafer 13 by polishing (or grinding, or both) the semiconductor wafer 13 from any of main surfaces (first and second main surfaces) 13a, 13b to a position correspond to a predetermined thickness. Warpage of the semiconductor wafer 13 is when the semiconductor wafer 13 has a shape, in a cross-sectional view thereof, curved in a protruding shape that protrudes in a direction (direction of curvature) toward the stage 11 (downward protrusion) (FIG. 1) or when the semiconductor wafer 13 has a shape, in a cross-sectional view thereof, curved in a protruding shape that protrudes in a direction away from the stage 11 the stage 11 (upward protrusion) (FIG. 2).

A center of the semiconductor wafer 13 is a chip effective region (not depicted) in which regions (hereinafter, chip regions, not depicted) constituting semiconductor chips after dicing (cutting) of the semiconductor wafer 13. In the chip effective region, dicing lines disposed in a grid pattern and the chip regions disposed in a matrix-like pattern, each having a substantially rectangular shape in a plan view thereof and a periphery thereof surrounded by the dicing lines, are provided. Between the chip effective region and an end (side surface) of the semiconductor wafer 13, is a non-operating region 13c that is free of the chip regions. The non-operating region 13c of the semiconductor wafer 13 is provided along an outer periphery of the semiconductor wafer 13, surrounding a periphery of the chip effective region.

In the semiconductor wafer 13, in the respective chip regions, semiconductor devices are formed such as an IGBT, MOSFET, diode, etc. employing a vertical element device structure through which a main current flows in the depth direction or the thickness direction (direction opposite to the depth direction). On both main surfaces of the semiconductor wafer 13, a metal electrode is formed. One of the main surfaces (any one of main surfaces 13a, 13b) of the semiconductor wafer 13, constituting a front surface of the semiconductor wafer 13 has a portion excluding the metal electrode, covered by a protective film formed using a resin material, and an entire area of the other main surface constituting a back surface is covered by the metal electrode. A thickness of the semiconductor wafer 13 is reduced to a thickness corresponding to ON resistance and breakdown voltage of a power semiconductor device.

The stage 11, for example, is a pedestal having a substantially circular shape, in a plan view thereof, with a diameter at least equal to a diameter of the semiconductor wafer 13 and flat surfaces (first and second surfaces) 11a, 11b on both sides. The stage 11, in an outer periphery of the surface (placement surface) 11a thereof on which the semiconductor wafer 13 is placed, has a first holding part 11c that holds the semiconductor wafer 13. The first holding part 11c is a protrusion that protrudes in a direction away from the placement surface 11a of the stage 11 and has an apex portion in contact with the non-operating region 13c of a main surface of the semiconductor wafer 13, the main surface facing the stage 11 (i.e., the facing surface; here, an instance in which the main surface 13a faces the stage 11 is described as an example); the first holding part 11c holds the semiconductor wafer 13 at a height position such that the semiconductor wafer 13 is not in contact with the placement surface 11a of the stage 11.

The first holding part 11c may be supported by the stage 11 in a moveable state so that a height position, in a vertical direction (raised in a direction away from the placement surface 11a of the stage 11, lowered in a direction toward the placement surface 11a of the stage 11), of the apex portion of the first holding part 11c from the placement surface 11a of the stage 11 is changed. The first holding part 11c is movable in a vertical direction, whereby a height position of the apex portion of the first holding part 11c from the placement surface 11a of the stage 11 is variable and configuration may be such that the entire first holding part 11c is raised and/or lowered or configuration may be such that a length (in vertical direction) of the first holding part 11c is increased and/or decreased in a vertical direction.

The first holding part 11c is movable so that a height position of the semiconductor wafer 13 from the placement surface 11a of the stage 11 is variable. Therefore, for example, after the height position of the apex portion of the first holding part 11c is raised to a position such that the semiconductor wafer 13 would not be in contact with the placement surface 11a of the stage 11, the semiconductor wafer 13 is placed on the placement surface 11a of the stage 11 and held by the first holding part 11c. Thereafter, before warpage of the semiconductor wafer 13 is corrected, an interval between the semiconductor wafer 13 and the stage 11 may be reduced by lowering the height position of the apex portion of the first holding part 11c to an extent that the semiconductor wafer 13 is not in contact with the placement surface 11a of the stage 11.

The facing surface 13a of the semiconductor wafer 13 is put in contact with the first holding part 11c after the height position of the apex portion of the first holding part 11c is raised, whereby, for example, when warpage curving the semiconductor wafer 13 to have downward protruding shape occurs, the apex portion of substantially a center of the facing surface 13a of the semiconductor wafer 13 may be prevented from contacting the placement surface 11a of the stage 11. Further, after the interval between the semiconductor wafer 13 and the stage 11 is reduced, the warpage of the semiconductor wafer 13 is corrected as described hereinafter, whereby adjustment of pressure (air pressure) between the semiconductor wafer 13 and the stage 11 may be performed in a short time with favorable controllability.

The first holding part 11c, for example, may include multiple parts scattered along the outer periphery of the placement surface 11a of the stage 11 (refer to FIG. 3), or may have a circular shape in a plan view thereof, extending along the outer periphery of the placement surface 11a of the stage 11 (not depicted). A second holding part 17a in contact with the non-operating region 13c of an inspection surface (the main surface opposite to the facing surface 13a) 13b of the semiconductor wafer 13 may be provided at a position further away from the placement surface 11a of the stage 11 than is the position of the first holding part 11c. A cross-sectional shape of the second holding part 17a is similar to that of the first holding part 11c and arrangement of the second holding part 17a, for example, is plane-symmetrical to the first holding part 11c with respect to the semiconductor wafer 13 placed on the first holding part 11c (refer to FIG. 3).

The second holding part 17a is, for example, a protrusion that protrudes toward the stage 11 from a fixing jig 17 that has a substantially circular frame-like shape disposed facing the placement surface 11a of the stage 11. The fixing jig 17, for example, has an external dimension that is substantially a same as that of the stage 11 and is supported by columnar-shaped supports 18, in a state enabling a height position of the fixing jig 17 to be changed in a vertical direction 19 (doubled-headed arrow in vertical direction) from the placement surface 11a of the stage 11 (raised in a direction away from the placement surface 11a of the stage 11, lowered in a direction toward the placement surface 11a of the stage 11). Substantially same external dimensions mean substantially equal external dimensions in a range including an allowable error due to a formation process.

For example, a length of the supports 18 is increased or decreased in the vertical direction 19, whereby the height position of the fixing jig 17 from the placement surface 11a of the stage 11 is changed and the height position of the second holding part 17a disposed on the fixing jig 17 is determined relative to the placement surface 11a of the stage 11. The second holding part 17a has an apex portion in contact with the non-operating region 13c of the inspection surface 13b of the semiconductor wafer 13 and holds the semiconductor wafer 13 at a height position such that the semiconductor wafer 13 is not in contact with the placement surface 11a of the stage 11. The non-operating region 13c of the semiconductor wafer 13 is sandwiched between the apex portions of the first and the second holding parts 11c, 17a, whereby the semiconductor wafer 13 is fixed above the stage 11.

The second holding part 17a is provided, whereby misalignment of the semiconductor wafer 13 may be suppressed compared to an instance in which the semiconductor wafer 13 is held by only the first holding part 11c. For example, the semiconductor wafer 13 warped curving in a downward protruding shape is placed on the apex portion of the first holding part 11c and thereafter, the non-operating region 13c of the semiconductor wafer 13 is pressed against the first holding part 11c therebelow by the second holding part 17a from the inspection surface 13b. As a result, warpage of the semiconductor wafer 13 is slightly corrected and the apex portion of substantially the center of the facing surface 13a of the semiconductor wafer 13 may be prevented from contacting the placement surface 11a of the stage 11.

The first and the second holding parts 11c, 17a are formed using a resin material that does not easily adhere to the semiconductor wafer 13. When the first and the second holding parts 11c, 17a are formed using a resin material that easily adheres to the semiconductor wafer 13 such as Teflon (registered trademark), the semiconductor wafer 13 may be adversely affected by matter attached to the first and the second holding parts 11c, 17a. Further, a portion of the first and the second holding parts 11c, 17a peels at parts in contact with the semiconductor wafer 13, whereby misalignment of the semiconductor wafer 13 may occur. In particular, the first and the second holding parts 11c, 17a, for example, may be preferably formed using a polyether ether ketone (PEEK) resin.

In the stage 11, at the placement surface 11a, air suction holes 15 and air supply holes 16 are disposed separate from one another. The air suction holes 15 and the air supply holes 16 may penetrate through the stage 11 between both surfaces (flat surface) 11a, 11b or may penetrate through the stage 11, from the placement surface 11a to a side surface of the stage 11. The semiconductor wafer 13 placed on the stage 11 is pulled toward the stage 11 at portions thereof facing the air suction holes 15 and is pushed away from the stage 11 at portions thereof facing the air supply holes 16. Therefore, arrangement, quantities, and diameters of the air suction holes 15 and the air supply holes 16 are respectively set so that warpage of the semiconductor wafer 13 is corrected.

The arrangement, quantities, and diameters of the air suction holes 15 and the air supply holes 16 are obtained in advance based on the diameter, thickness, etc. of the semiconductor wafer 13, the amount of warpage (interval between the surface of the semiconductor wafer 13 and the stage 11), the direction of curvature (direction of protrusion), etc. As described above, the amount of warpage and the direction of curvature of the semiconductor wafer 13 are determined according to the element device structures formed in the chip regions. Therefore, these conditions, for example, suffice to be obtained by simulation or a general principle based on experience by experiment and actual inspection. The stage 11 fabricated under these conditions obtained in advance is used, whereby warpage of the semiconductor wafer 13 is corrected and the semiconductor wafer 13 may be made flat.

For example, when the semiconductor wafer 13 is warped curving in a downward protruding shape, a portion of the semiconductor wafer 13 near the outer periphery is furthest from the stage 11 while a portion near the center is closest to the stage 11 (refer to FIG. 1). Therefore, the stage 11 is prepared having, at the placement surface 11a, the air suction holes 15 disposed at positions facing the outer periphery of the semiconductor wafer 13 and the air supply holes 16 (16a) disposed at positions facing a vicinity of the center of the semiconductor wafer 13. A vicinity of the outer periphery of the semiconductor wafer 13 is pulled toward the stage 11 and a vicinity of the center of the semiconductor wafer 13 is pushed away from the stage 11 by the stage 11, whereby the warpage of the semiconductor wafer 13 is corrected.

On the other hand, when the semiconductor wafer 13 is warped curving in an upward protruding shape, a portion of the semiconductor wafer 13 near the outer periphery is closest to the stage 11 while a portion near the center is furthest from the stage 11 (refer to FIG. 2). Therefore, the stage 11 is prepared having, at the placement surface 11a, the air suction holes 15 disposed at positions facing a vicinity of the center of the semiconductor wafer 13 and the air supply holes 16 (16b) disposed at positions facing the outer periphery of the semiconductor wafer 13. A vicinity of the outer periphery of the semiconductor wafer 13 is pushed away from the stage 11 and a vicinity of the center of the semiconductor wafer 13 is pulled toward the stage 11 by the stage 11, whereby the warpage of the semiconductor wafer 13 is corrected.

In particular, the air suction holes 15 may be disposed substantially uniformly like pores of a porous ceramic, spanning an entire area of the placement surface 11a of the stage 11. For example, the air suction holes 15 may be disposed scattered at predetermined intervals in a radial shape from the center of the stage 11 (refer to FIG. 4). The air suction holes 15 have first openings and second openings, the first openings at the placement surface 11a of the stage 11 face the semiconductor wafer 13 and the second openings are connected to external air suction equipment (for example, vacuum pumps: suction units) via pipes 33 (refer to FIGS. 4 to 6). For each predetermined section 31a, 31b, and 31c of the placement surface 11a of the stage 11, the air suction holes 15 therein may be collectively connected to air suction equipment dedicated to said predetermined section 31a to 31c via a respective dedicated one of the pipes 33.

As a result, for each of the predetermined sections 31a to 31c, the air suction holes 15 therein are collectively connected to section-dedicated air suction equipment via a section-dedicated one of the pipes 33, and atmosphere between the facing surface 13a of the semiconductor wafer 13 and the air suction holes 15 may be suctioned out in extraction amounts that differ according to the predetermined sections 31a to 31c. The arrangement, quantity, and diameter of the air suction holes 15 may be changed according to the predetermined sections 31a to 31c. FIGS. 5 and 6 depict an instance in which the air suction holes 15 of the predetermined section 31c of the placement surface 11a of the stage 11 (hatched portions) are connected to the section-dedicated air suction equipment thereof via the section-dedicated one of the pipes 33c thereof. For air suction equipment connection of the air suction holes 15 of the predetermined sections 31a, 31b, the air suction holes 15 of the predetermined sections 31a, 31b suffice to be connected to the section-dedicated air suction equipment thereof, similarly to the air suction holes 15 of the predetermined section 31c depicted in FIGS. 5 and 6.

Atmosphere (air) between the semiconductor wafer 13 and the stage 11 is suctioned out (arrow pointing downward in FIGS. 1 and 2) from the air suction holes 15 via the pipes 33 by operation of the air suction equipment. As a result, by negative pressure generated by a reduction of pressure between the facing surface 13a of the semiconductor wafer 13 and the air suction holes 15, portions of the semiconductor wafer 13 facing the air suction holes 15 are pulled toward the stage 11. For the air suction equipment, general pressure controllers (vacuum pumps) may be used. In particular, the air suction equipment, for example, may be a Pressure Switch PS6 (trademark) of NIDEC Copal Electronics (trademark).

The air supply holes 16 may be disposed at positions so that the interval between the semiconductor wafer 13 and the stage 11 becomes relatively close (refer to FIGS. 1 and 2) or the air supply holes 16 may be disposed at predetermined intervals in the placement surface 11a of the stage 11 (for example, disposed scattered in a radial shape from the center of the stage 11) (refer to FIG. 4). The air supply holes 16 have first openings and second openings, the first openings at the placement surface 11a of the stage 11 face the semiconductor wafer 13 and the second openings are connected to external air supply equipment (for example, air pumps or compressed cylinders: air supply units) via pipes 32 (refer to FIGS. 4 and 5). For each of the predetermined sections 31a to 31c of the placement surface 11a of the stage 11, the air supply holes 16 therein may be collectively connected to air suction equipment dedicated to said predetermined section 31a to 31c via a respective dedicated one of the pipes 32.

As a result, for each of the predetermined sections 31a to 31c, the air supply holes 16 therein are collectively connected to section-dedicated air suction equipment via a section-dedicated one of the pipes 32, and air may be supplied between the facing surface 13a of the semiconductor wafer 13 and the air supply holes 16 in supply amounts that differ according to the predetermined sections 31a to 31c. The arrangement, quantity, and diameter of the air supply holes 16 may be changed according to the predetermined sections 31a to 31c. FIG. 5 depicts an instance in which the air supply holes 16 of the predetermined section 31c of the placement surface 11a of the stage 11 (hatched portions) are connected to the section-dedicated air supply equipment thereof via the section-dedicated one of the pipes 32c. For air supply equipment connection of the air supply holes 16 of the predetermined sections 31a, 31b, the air supply holes 16 of the predetermined sections 31a, 31b suffice to be connected to the section-dedicated air supply equipment thereof, similarly to the air supply holes 16 of the predetermined section 31c depicted in FIG. 5.

Gas (air) is supplied between the semiconductor wafer 13 and the stage 11, from the air supply holes 16 via the pipes 32 by operation of the air supply equipment (arrow pointing upward in FIGS. 1 and 2). As a result, pressure (air pressure) between the facing surface 13a of the semiconductor wafer 13 and the air supply holes 16 increases and portions of the semiconductor wafer 13 facing the air supply holes 16 are pushed up in a direction away from the stage 11. For the air supply equipment, a general pressure controller (pump) may be used. In particular, the air supply equipment, for example, may be a Pressure Switch PS6 (trademark) of NIDEC Copal Electronics (trademark), similarly to that connected to the air suction holes 15.

In FIG. 4, an instance in which the quantity of the air supply holes 16 is greater than the quantity of the air suction holes 15 and the diameter of the air supply holes 16 is greater than the diameter of the air suction holes 15; however, as described above, the arrangement, the quantities, and the diameters of the air suction holes 15 and the air supply holes 16 are set in advance based on states (diameter, thickness, amount of warpage, direction of curvature) of the semiconductor wafer 13. Further, the extraction amount of the air suction holes 15 and the supply amount of the air supply holes 16 are adjusted, whereby the same stage 11 may be used for any state (amount of warpage and direction of curvature) of warpage of the semiconductor wafer 13. The extraction amount of the air suction holes 15 and the supply amount of the air supply holes 16 suffice to be obtained in advance based on states of the semiconductor wafer 13.

In an instance in which both main surfaces 13a, 13b of the semiconductor wafer 13 are inspected, one main surface of the semiconductor wafer 13 when facing the stage 11 is curved in a downward protruding shape while the other main surface when facing the stage 11 is curved in an upward protruding shape. In this case, the stage 11 may include multiple stages respectively prepared for the main surfaces 13a, 13b of the semiconductor wafer 13. Alternatively, the stage 11 may be a single stage for which the arrangement, the quantities, and the diameters of the air suction holes 15 and the air supply holes 16 are set enabling application to any warped state of the semiconductor wafer 13, the stage 11 being used by adjusting the extraction amount of the air suction holes 15 and the supply amount of the air supply holes 16.

Figure 9:
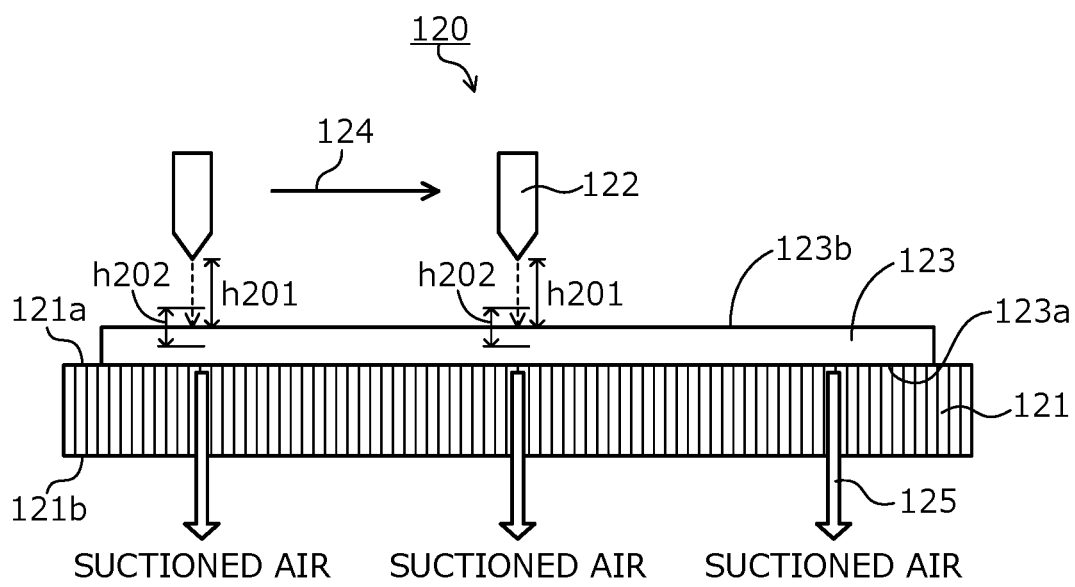
FIG. 9 is a cross-sectional view schematically depicting another example of a state of a semiconductor wafer during inspection by a conventional semiconductor inspection device.

Configuration of the inspection head 12 is similar to the configuration of the inspection head 122 of a typical semiconductor-wafer external inspection device (refer to FIG. 9). The inspection head 12 has an optical system lens that forms an image of an object at a predetermined depth of focus (imaging range) and an imaging unit that photographs (or observes) the object. The inspection head 12 is disposed facing the semiconductor wafer 3 (the object) placed on the placement surface 11a of the stage 11. The inspection head 12 while being conveyed (scans) parallel to the placement surface 11a of the stage 11 by the conveying unit (not depicted), captures an image of the main surface (inspection surface) 3b of the semiconductor wafer 3 facing the inspection head 12.

When an image is captured by the inspection head 12, the semiconductor wafer 3 on the stage 11 is in a substantially flat state with warpage thereof being corrected. The semiconductor wafer 3 being in a substantially flat state means that at the inspection surface 3b of the semiconductor wafer 3, an absolute value of an amount of change of an interval h1 between the inspection head 12 and the inspection surface 3b of the semiconductor wafer 3 is in a range from about 0 mm to 0.1 mm. The semiconductor wafer 3 on the stage 11 is in a substantially flat state and therefore, a depth of focus h2 of the inspection head 12 at the inspection surface 3b of the semiconductor wafer 3 is kept constant and a focused image may be captured at any location, in the outer periphery or inward toward and in the center of the semiconductor wafer 3.

A method of inspecting the semiconductor wafer 3 using the semiconductor inspection devices 10a, 10b according to the embodiment (refer to FIGS. 1 to 6) is described. In the semiconductor wafer 13, predetermined vertical element device structures are formed by a general method of manufacturing a semiconductor device. During formation of the element device structures, thickness of the semiconductor wafer 13 is reduced, whereby warpage of the semiconductor wafer 13 occurs. On the first holding part 11c of the stage 11 according to the embodiment, after the semiconductor wafer 13 is placed thereon but before an image of the inspection surface 13b of the semiconductor wafer 13 is captured by the inspection head 12, the warpage of the semiconductor wafer 13 is corrected on the stage 11.

In correcting the warpage of the semiconductor wafer 13, first, as described above, based on the state (diameter, thickness, the amount of warpage, direction of curvature) of the semiconductor wafer 13, the arrangement, quantities, and diameters of the air suction holes 15 and the air supply holes 16 of the stage 11 are obtained (obtaining process). Based on the state of the semiconductor wafer 13 and conditions for the air suction holes 15 and the air supply holes 16, the extraction amount of the air suction holes 15 and the supply amount of the air supply holes 16 may be obtained. In this instance, for each of the predetermined sections 31a to 31c of the placement surface 11a of the stage 11, a predetermined number of the air suction holes 15 may be connected to section-dedicated air suction equipment thereof and a predetermined number of the air supply holes 16 may be connected to section-dedicated air supply equipment thereof.

Next, the stage 11 satisfying the obtained conditions for the air suction holes 15 and the air supply holes 16 is prepared and attached to the semiconductor inspection devices 10a, 10b according to the embodiment. Next, the semiconductor wafer 13, with the main surface (the facing surface 13a) thereof opposite to the inspection surface (in FIGS. 1 and 2, the main surface 13b) thereof facing the stage 11, is placed above the placement surface 11a of the stage 11 and held by the first holding part 11c (holding process). At this time, in an instance in which the fixing jig 17 (refer to FIG. 3) is included, the semiconductor wafer 13 may be further held by the second holding part 17a from the inspection surface 13b of the semiconductor wafer 13, so as to be sandwiched between the first and the second holding parts 11c, 17a.

Next, the air suction equipment and the air supply equipment are operated concurrently and atmosphere between the semiconductor wafer 13 and the stage 11 is suctioned out from the air suction holes 15 by the extraction amount obtained in advance (suction process) while gas is supplied between the semiconductor wafer 13 and the stage 11, from the air supply holes 16 by the supply amount obtained in advance (supply process). As a result, portions of the semiconductor wafer 13 facing the air suction holes 15 are pulled toward the stage 11 and portions thereof facing the air supply holes 16 are pushed up away from the stage 11, whereby warpage may be corrected, without the facing surface 13a of the semiconductor wafer 3 being in contact with the stage 11. Therefore, occurrences of new defects of the semiconductor wafer 3 may be suppressed.

Next, by a single scan 14 (horizontal arrow) by the inspection head 12, spanning an entire area of the inspection surface 3b of the semiconductor wafer 3, an image of the inspection surface 3b of the semiconductor wafer 3 is captured (imaging process), and storage of captured images to a storage device (not depicted) and determination of good and defective chip regions of the semiconductor wafer 3 based on information obtained in advance and the captured images is performed by a computational device (not depicted). The semiconductor wafer 3 is in a substantially flat state with warpage thereof being corrected, whereby the interval h1 between the inspection surface 3b and the inspection head 12 becomes substantially constant across the inspection surface 3b. Therefore, external inspection of an entire area of the inspection surface 3b of the semiconductor wafer 3 may be performed with the depth of focus h2 kept constant.

Conditions for the air suction holes 15 and the air supply holes 16, and the extraction amount and the supply amount of the gas, preferably, may be set by looking at the balance of flow of the gas between the semiconductor wafer 13 and the stage 11, at the surface of the semiconductor wafer 3. The stage 11, the inspection head 12, the conveying unit, the computation device, the air suction equipment, and the air supply equipment, etc. are controlled by a controller (not depicted) of the semiconductor inspection devices 10a, 10b. Further, the method of inspecting the semiconductor wafer 13 according to the present embodiment may be implemented by executing a prepared program on a computer such as personal computer or a workstation, a database server, webserver, etc.

Further, the program for implementing the method of inspecting the semiconductor wafer 13 according to the present embodiment is recorded to a computer-readable recording medium such as a solid-state drive (SSD), a hard disk, a Blu-ray (registered trademark) Disc (BD), a flexible disk, a USB flash memory, a CD-ROM, an MO, a DVD, etc., and is executed by being read out from the recording medium by a computer or a server, etc. Further, the program may be a transmission medium distributed through a network such as the Internet.

Further, even in a semiconductor wafer 43 depicted in FIG. 7 and having a rib-like shape in which a thickness of a center portion thereof is made thinner while the thickness of an outer peripheral portion thereof having a predetermined width is left thick, warpage occurring in the center having a thin thickness may be corrected in a state in which the semiconductor wafer 43 is placed above the stage 11, similarly to the normal semiconductor wafer 13 as described above. The semiconductor wafer 43 having the rib-like shape is fabricated by polishing (or grinding, or both) a center portion of a semiconductor wafer having a substantially uniform thickness, from one main surface 43a of the semiconductor wafer 43 while leaving the thickness of the outer peripheral portion of the predetermined width along the outer periphery to be thicker than the thickness of the center portion, the outer peripheral portion constituting a non-operating region 43c. A substantially uniform thickness means a same thickness in a range including an allowed error due to process variation.

In the semiconductor wafer 43 having the rib-like shape, warpage curving the center portion having the reduced thickness in an upward or a downward protruding shape occurs. FIG. 7 depicts the semiconductor wafer 43 having the rib-like shape, in which steps are created by the center portions of both of the main surfaces 43a, 43b due to a difference in the thicknesses of the center portion and the outer peripheral portion, thereby curving the semiconductor wafer 43 so as to protrude on the main surface 43a side in a protruding shape. The semiconductor wafer 43 having the rib-like shape, for example, is placed above the placement surface 11a of the stage 11 and held by the first holding part 11c with the main surface (facing surface) 43a where a step occurs due to the difference in the thicknesses of the center portion and the outer peripheral portion facing the stage 11. In the semiconductor wafer 43 having the rib-like shape, a portion (rib) 43d of the outer peripheral portion where the thickness is left thick is in contact with the first holding part 11c.

As described above, according to the embodiment, the stage of the semiconductor inspection device has, at the placement surface where the semiconductor wafer is placed, the holding parts that hold the semiconductor wafer, the air suction holes that suction out gas between the semiconductor wafer and the stage, the air supply holes that supply gas between the semiconductor wafer and the stage, and the inspection head that inspects an external appearance of the semiconductor wafer. In the stage, at the placement surface thereof, the air suction holes and the air supply holes for which arrangement, quantities, and diameters thereof are obtained and determined in advance based on the state of the semiconductor wafer are provided. The semiconductor wafer is held by the holding parts above the placement surface of the stage so as not to be in contact with the placement surface of the stage.

In this state, gas between the semiconductor wafer and the stage is suctioned out from the air suction holes and gas is supplied between the semiconductor wafer and the stage from the air supply holes. As a result, portions of the semiconductor wafer facing the air suction holes are pulled toward the stage and portions thereof facing the air supply holes are pushed away from the stage and thus, warpage of the semiconductor wafer may be corrected without the semiconductor wafer being in contact with the stage. Accordingly, during inspection of the semiconductor wafer, an occurrence of a defect of the semiconductor wafer may be suppressed and defects occurring during formation of the element device structures in the semiconductor wafer (defects that occurred other than during inspection of the semiconductor wafer) may be assuredly detected.

Further, according to the embodiment, external inspection of the semiconductor wafer in a substantially flat state in which warpage has been corrected is performed and therefore, the interval between the inspection head and the inspection surface of the semiconductor wafer is substantially constant, enabling external inspection of the semiconductor wafer to be performed with the depth of focus kept in constant over an entire area of the inspection surface of the semiconductor wafer. Therefore, occurrence of defects during inspection of the semiconductor wafer are suppressed and external inspection of chip regions adjacent to one another in the semiconductor wafer may be performed continuously with stable inspection sensitivity. Further, warpage of the semiconductor wafer is corrected on the stage, whereby the depth of focus is kept constant and thus, external inspection of the semiconductor wafer may be automated.

In the foregoing, without limitation to the embodiments described above, various modifications within a range not departing from the spirit of the invention are possible. For example, in the embodiments described above, while an instance in which the external inspection of the semiconductor wafer is performed under a normal atmosphere is described as an example, without limitation hereto, the external inspection of the semiconductor wafer may be performed under a gas atmosphere other than a normal atmosphere. While an instance in which the air suction holes and the air supply holes of the stage above which the semiconductor wafer is placed are connected to external air suction equipment and external air supply equipment, respectively, without limitation hereto, air suction equipment and air supply equipment may be provided as components of the semiconductor inspection device.

According to the invention described above, portions of the semiconductor wafer facing the air suction holes are pulled toward the stage and portions thereof facing the air supply holes are pushed away from the stage, whereby warpage of the semiconductor wafer may be corrected without the semiconductor wafer being in contact with the stage. Further, external inspection of the semiconductor wafer in a substantially flat state with warpage being corrected is performed and therefore, the interval between the inspection head and the inspection surface of the semiconductor wafer is substantially constant, enabling external inspection of the semiconductor wafer to be performed with the depth of focus kept constant over an entire area of the inspection surface of the semiconductor wafer.

The semiconductor inspection device and the method of inspecting a semiconductor wafer according to the present invention achieve an effect in that an occurrence of defects during inspection of a semiconductor wafer is suppressed and inspection sensitivity of the semiconductor wafer may be stabilized.

As described above, the semiconductor inspection device and the method of inspecting a semiconductor wafer according to the present invention are useful for a semiconductor wafer on which a vertical device element structure is formed and are particularly suitable for a semiconductor wafer having a large diameter.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor inspection device configured to capture an image of a semiconductor wafer, after gas is concurrently suctioned from and supplied to a space between the semiconductor wafer and a stage, for correcting a warpage of the semiconductor wafer, the semiconductor inspection device comprising:
   the stage, having
      a first surface, for placing thereon a semiconductor wafer that has a first main surface and a second main surface opposite to each other, and
      a second surface opposite to the first surface;
   a first holding part provided on the stage and protruding from the first surface of the stage, the first holding part being configured to be in contact with the first main surface of the semiconductor wafer to thereby hold the semiconductor wafer, such that the first main surface of the semiconductor wafer is apart from the first surface of the stage, the space being formed between the first main surface of the semiconductor wafer and the first surface of the stage;
   a plurality of air suction holes, through which the gas in the space between the semiconductor wafer and the stage is suctioned, each of the air suction holes having
      a first opening provided at a predetermined first position in the first surface of the stage, and
      a second opening for connecting to a vacuum pump;
   a plurality of air supply holes for supplying the gas to the space between the semiconductor wafer and the stage, each of the air supply holes having
      a first opening provided at a predetermined second position in the first surface of the stage, and
      a second opening for connecting to an air pump; and
   an inspection head configured to capture an image of the second main surface of the semiconductor wafer.

2. The semiconductor inspection device according to claim 1, wherein
   the first holding part is configured to be in contact with an outer peripheral portion of the first main surface of the semiconductor wafer.

3. The semiconductor inspection device according to claim 1, wherein
   the first holding part is configured to be supported by the first surface of the stage in a moveable manner, so as to move the semiconductor wafer in a first direction away from the first surface of the stage and in a second direction toward the first surface of the stage.

4. The semiconductor inspection device according to claim 1, further comprising
   a second holding part provided facing the first holding part, and configured to be in contact with a portion of the second main surface of the semiconductor wafer, to thereby hold the semiconductor wafer between the first and second holding parts.

5. The semiconductor inspection device according to claim 1, wherein
   the first surface of the stage has a plurality of predetermined sections;
   the vacuum pump includes a plurality of section-dedicated vacuum pumps, respectively corresponding to the plurality of predetermined sections; and
   each of the predetermined sections has a number of the air suction holes formed therein, which are collectively connected to one of the section-dedicated vacuum pumps corresponding to said each predetermined section, different amounts of the gas being suctioned from the space between the semiconductor wafer and the stage from different ones of the predetermined sections.

6. The semiconductor inspection device according to claim 1, wherein
   the first surface of the stage has a plurality of predetermined sections;
   the air pump includes a plurality of section-dedicated air pumps respectively corresponding to the plurality of predetermined sections;
   each of the predetermined sections has a number of the air supply holes formed therein, which are collectively connected to one of the section-dedicated air pumps corresponding to said each predetermined section, different amounts of the gas being supplied to the space between the semiconductor wafer and the stage from different ones of the predetermined sections.

7. The semiconductor inspection device according to claim 1, wherein
the predetermined first positions of the air suction holes and the predetermined second positions of the air supply holes are predetermined based on a state of the warpage of the semiconductor wafer.

8. A method of inspecting the semiconductor wafer using the semiconductor inspection device according to claim 1, the method comprising:
- a holding process including holding the semiconductor wafer at a position apart from the first surface of the stage by the first holding part, the first main surface of the semiconductor wafer facing the stage, a portion of the first main surface being in contact with the first holding part;
- a suction process including suctioning the gas from the space between the semiconductor wafer and the stage, through the plurality of air suction holes;
- a supply process including supplying the gas to the space between the semiconductor wafer and the stage, through the plurality of air supply holes; and
- an imaging process including capturing an image of the second main surface of the semiconductor wafer by the inspection head, wherein the imaging process is performed after concurrently performing the suction process and the supply process to correct a warpage of the semiconductor wafer.

9. The method according to claim 8, further comprising an obtaining process including, before the holding process, obtaining the predetermined first positions for the air suction holes and the predetermined second positions for the air supply holes in the first surface of the stage, based on a state of the warpage of the semiconductor wafer, such that the air suction holes and the air supply holes are disposed at the predetermined first and second positions accordingly.

* * * * *